United States Patent
Roy

(10) Patent No.: US 7,586,172 B2
(45) Date of Patent: Sep. 8, 2009

(54) BLOOMING CONTROL METHOD FOR A PHOTODIODE AND CORRESPONDING INTEGRATED CIRCUIT

(75) Inventor: Francois Roy, Seyssins (FR)

(73) Assignee: STMicroelectronics SA, Montrouge (FR)

( * ) Notice: Subject to any disclaimer, the term of this patent is extended or adjusted under 35 U.S.C. 154(b) by 242 days.

(21) Appl. No.: 10/498,731

(22) PCT Filed: Dec. 12, 2002

(86) PCT No.: PCT/FR02/04302

§ 371 (c)(1),
(2), (4) Date: Dec. 8, 2004

(87) PCT Pub. No.: WO03/050874

PCT Pub. Date: Jun. 19, 2003

(65) Prior Publication Data

US 2005/0116270 A1    Jun. 2, 2005

(30) Foreign Application Priority Data

Dec. 12, 2001 (FR) .................................. 01 16047

(51) Int. Cl.
*H01L 29/72* (2006.01)
(52) U.S. Cl. .................. 257/462; 257/230; 257/292; 257/445; 257/450; 257/461
(58) Field of Classification Search .................. 257/462, 257/230, 292, 445, 450, 461
See application file for complete search history.

(56) References Cited

U.S. PATENT DOCUMENTS

| | | | | |
|---|---|---|---|---|
| 5,047,862 A | * | 9/1991 | Stevens | 348/299 |
| 5,734,191 A | | 3/1998 | Chi et al. | |
| 5,986,297 A | | 11/1999 | Guidash et al. | |
| 2002/0003611 A1 | * | 1/2002 | Ohashi | 353/31 |
| 2003/0085339 A1 | * | 5/2003 | Janesick | 250/208.1 |
| 2004/0085466 A1 | * | 5/2004 | Herold | 348/248 |
| 2004/0195592 A1 | * | 10/2004 | Fossum | 257/202 |

FOREIGN PATENT DOCUMENTS

| | | |
|---|---|---|
| JP | 57-037871 | 3/1982 |
| JP | 02-257673 | 10/1990 |
| JP | 09-252434 | 9/1997 |
| JP | 11-274455 | 10/1999 |

* cited by examiner

Primary Examiner—Edward Wojciechowicz
(74) Attorney, Agent, or Firm—Lisa K. Jorgenson; Jose Gutman; Fleit Gibbons Gutman Bongini & Bianco P.C.

(57) ABSTRACT

The photodiode comprises an upper pn junction (D1) formed between an upper layer and an intermediate layer supported by one portion of a semiconductor substrate. A lower junction is formed between the intermediate layer and the substrate portion. The forward bias voltage of the upper junction (D1) is lower than the forward bias voltage of the lower junction (D2). The charges are permitted to be stored in the photodiode until the said upper junction is forward-biased so as to favor (A1) the recombination of the carriers coming from the intermediate layer with the carriers of the upper layer.

20 Claims, 3 Drawing Sheets

BLOOMING CONTROL METHOD FOR A PHOTODIODE AND CORRESPONDING INTEGRATED CIRCUIT

FIELD OF THE INVENTION

The invention relates to microelectronics, especially to integrated circuits which include photodiodes and more particularly to the blooming control of such a photodiode.

BACKGROUND OF THE INVENTION

Image sensors based on semiconductor components work on the principle of converting photons into electron/hole pairs in silicon. More specifically, the charges created in the photosensitive regions are stored in the photodiode and are then read by an electronic system. This electronic system, which operates the photodiode, includes, especially when the photodiode is a fully depleted photodiode, a transfer transistor permitting transfer of the charges stored in the photodiode.

If no precautions are taken, under blooming conditions, the electrons that can no longer be stored in the photodiode can then diffuse into the semiconductor substrate where they disturb all the photodiodes of the image sensor. The visual result of this is an increasingly large white halo around the image.

To remedy this problem, one solution consists in defining the photodiode saturation level by the voltage applied to the gate of the transfer transistor. More specifically, this voltage is chosen so that the charges will be drained away towards the supply (via controlled conduction of a resetting transistor) before they diffuse into the substrate and degrade the signal received by the neighbouring photodiodes.

However, this voltage must be adjusted by a specific supply and must take into account the dispersions associated with the technology. Furthermore, these dispersions result in a reduction in the storage dynamic range of the photodiode.

SUMMARY OF THE INVENTION

The invention aims to remedy this drawback and provides a radically different solution for controlling the blooming of a photodiode.

The invention therefore provides an integrated circuit comprising at least one cell which includes a photodiode, this photodiode having a lower pn junction, formed between one portion of a semiconductor substrate and an intermediate layer located on the said substrate portion, and an upper pn junction formed between the intermediate layer and an upper layer more highly doped than the intermediate layer.

Moreover, the forward bias voltage of the upper junction is lower than the forward bias voltage of the lower junction.

Thus, the photodiode will store charges until the surface diode (upper junction) is turned on and the carriers (for example electrons) "not storable" in the photodiode will then be recombined with the carriers (for example holes) of the surface layer (upper layer) instead of diffusing into the substrate.

Thus, according to the invention, the maximum storage level is no longer defined by the channel voltage of an MOS transistor (the transfer transistor) but by the forward bias voltage of a junction.

The storage dynamic range of the photodiode is consequently increased. The problems associated with technology dispersions are also solved.

Moreover, the blooming control means comprise in this case the upper junction and the upper layer. They therefore form an integral part of the photodiode, this also being a general characteristic of the integrated circuit according to the invention.

The doping of the upper layer must be greater than the doping of the intermediate layer so as to contain more carriers (holes, for example) than the carriers (electrons) of the intermediate layer, so as to allow recombination during blooming.

Moreover, even if the forward bias voltage of the upper junction is lower than the forward bias voltage of the lower junction of the photodiode, there nevertheless remains in general a current in the substrate which also results from the lower junction being forward biased.

A person skilled in the art will know how to adjust, according to the applications and the maximum desired storage level of the photodiode, on the one hand, the doping of the upper layer with respect to the doping of the intermediate layer and, on the other hand, the ratio of the forward bias current of the upper junction to the forward bias current of the lower junction.

This being so, it is preferable to choose the doping of the upper layer to be at least five times higher, for example ten times higher, than the doping of the intermediate layer. Moreover, it is preferable to choose respective forward bias voltages of the two junctions so as to obtain a forward bias current of the upper junction at least ten times higher than the forward bias current of the lower junction.

According to one way of implementing the invention, the upper layer is formed from indium-doped silicon, while the intermediate layer is formed from phosphorus-doped silicon and the said substrate portion is formed from boron-doped silicon.

Having said this, other materials could be envisaged.

Thus, it is possible to replace the phosphorus with arsenic or antimony. In general, it will be possible to choose any material which decreases the gap between the valence band and the conduction band of silicon.

The subject of the invention is also an image sensor which includes at least one integrated circuit as defined above.

The subject of the invention is also a blooming control method for a photodiode produced in a semiconductor substrate.

According to a general feature of this method according to the invention, the photodiode includes an upper pn junction formed between an upper layer and an intermediate layer supported by a portion of the substrate and the method permits storage of the charges in the photodiode until the said upper junction is forward-biased so as to favour the recombination of the carriers coming from the intermediate layer with the carriers of the upper layer.

BRIEF DESCRIPTION OF THE DRAWINGS

Other advantages and features of the invention will become apparent on examining the detailed description of entirely non-limiting ways of implementation and of embodiments, together with the appended drawings in which.

DETAILED DESCRIPTION

Figure 1:
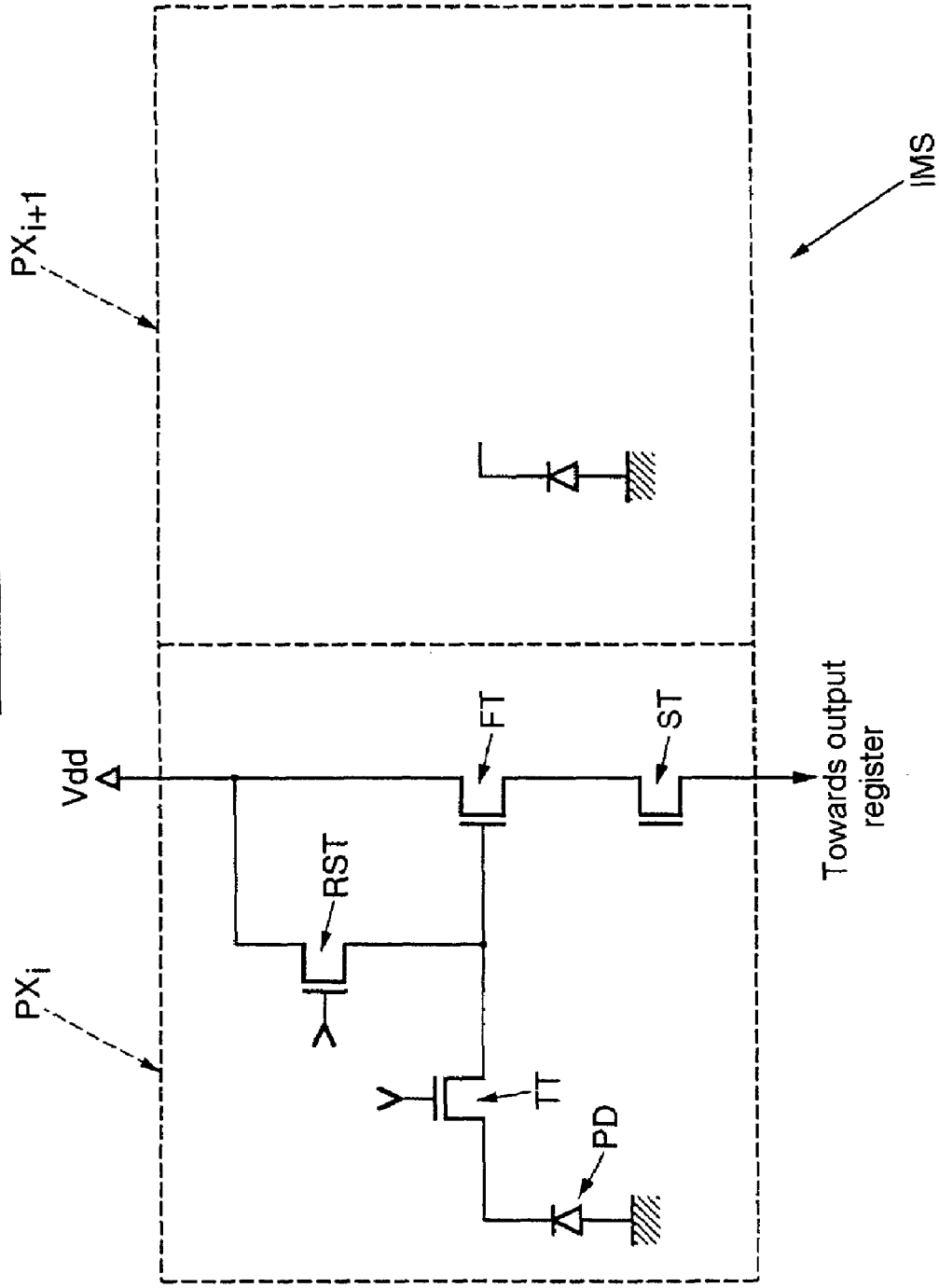
FIG. 1 illustrates schematically an image sensor according to the invention, formed from several cells equipped with photodiodes, according to the invention.

In FIG. 1, the reference IMS denotes in general an image sensor formed from a matrix of cells (or pixels) $PX_i$, each including one photodiode PD and means for controlling this photodiode.

In the example described here, the photodiode is a fully depleted photodiode and the control means are means consisting of four transistors TT, RST, FT and ST. Having said this, the invention is not limited to a fully depleted diode and applies to any photodiode, especially one whose associated control means comprise only three transistors.

The structure and the operation of the four-transistor control means of a fully depleted photodiode are conventional and well known to those skilled in the art. The main characteristics thereof will be recalled here with reference to FIG. 1.

These control means comprise a transfer transistor TT connected on one side to the photodiode PD and on the other side to the gate of a follower transistor FT. The gate of the follower transistor FT is also connected to the supply voltage Vdd via a resetting transistor, labelled RST.

Finally, a transistor ST for selecting the cell $PX_i$ connects the follower transistor FT to a capacitive output register.

With regard to the operation of the cell, the first phase is a phase of integrating or of storing the charges in the photodiode, during which phase the transfer transistor TT is off. During most of the integration phase, the resetting transistor is on. Then, just before the charges are transferred from the photodiode to the output, the transistor RST is turned off and then the selection transistor ST is turned on, thereby making it possible to determine the level of charge in the photodiode before transfer.

During transfer, the transfer transistor TT is turned on and then, while the resetting transistor is still off, the transistor TT is turned off again, marking the end of transfer. The selection transistor ST is then again turned on so as to be able to determine the level of charge after transfer.

After this second measurement, the resetting transistor RST is again turned on, while a new integration phase has already started.

The amount of light received by the photodiode is then determined by the difference between the two charge levels measured before and after transfer, respectively.

Although in the prior art the blooming control means include a specific supply for regulating the low level of the voltage applied to the gate of the transfer transistor TT, the control means according to the invention form an integral part of the photodiode PD, as explained in detail below.

The image sensor IMS, and more particularly each cell or pixel $PX_i$, is made in complementary metal oxide semiconductor (CMOS) technology.

Figure 2:
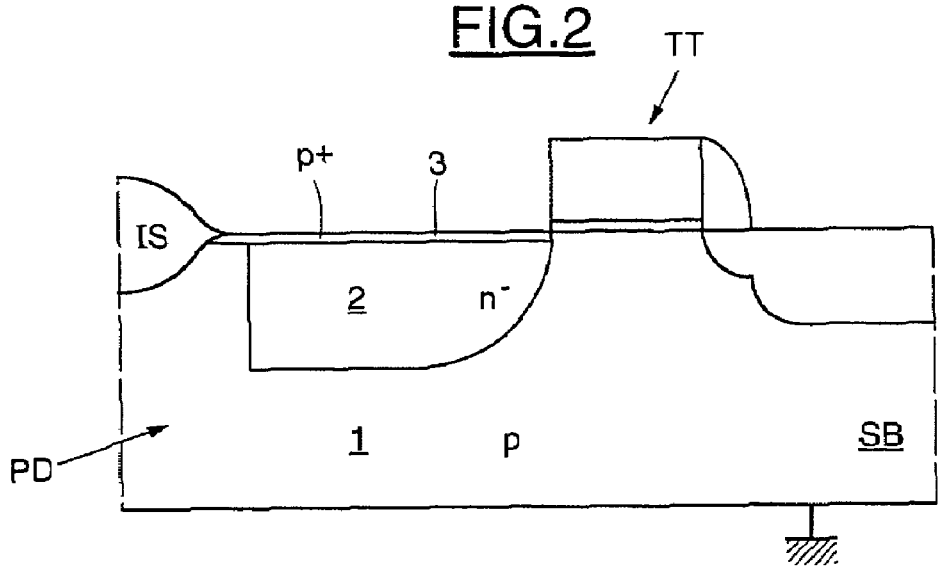
FIG. 2 illustrates schematically a semiconductor substrate of a photodiode, according to the invention.

FIG. 2 illustrates in greater detail the semiconductor structure of the photodiode PD of a cell $PX_i$.

In this FIG. 2, the reference SB denotes a silicon semiconductor substrate, in this case p-doped. This substrate SB may, for example, be a p-doped well and lie within a $p^+$-doped semiconductor wafer. The substrate SB is earthed.

The transfer transistor TT is a MOS transistor whose $n^-$-doped source 2 forms, for the photodiode PD, an intermediate layer which extends above the portion 1 of the substrate SB.

Produced above this intermediate layer 2, for example by implantation, is a p+-doped upper layer 3 that extends as far as an isolating region IS, for example a region of a local oxidation of silicon (LOCOS) type, using the name well known to those skilled in the art. Moreover, the portion 1 of the substrate SB comes into contact with the p+-doped upper layer 3.

The photodiode PD is therefore in this case formed from these three layers, which define two pn junctions (diodes), namely an upper junction formed from the layers 2 and 3 and a lower junction formed from the layer 2 and the subjacent portion of the substrate 1.

Figure 3A:
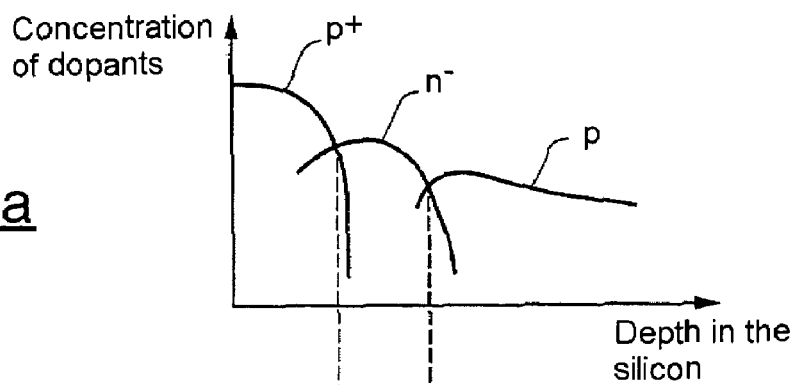
FIG. 3a illustrates schematically an example of the doping of the various layers forming a photodiode, according to the invention.

An example of the doping profile of this photodiode PD is illustrated in FIG. 3a. More specifically, the $p^+$-doped upper layer 3 is more highly doped than the intermediate layer 2, which is itself more highly doped than the subjacent portion of the substrate 1.

By way of indication, the doping of the upper layer 3 may be chosen between $10^{18}$ and $10^{19}$ at./cm$^3$.

The doping of the intermediate layer 2 may itself be chosen between $10^{17}$ and $10^{18}$ at./cm$^3$, while the doping of the subjacent substrate portion 1 may be chosen to be less than $10^{16}$ at./cm$^3$.

Figure 3B:
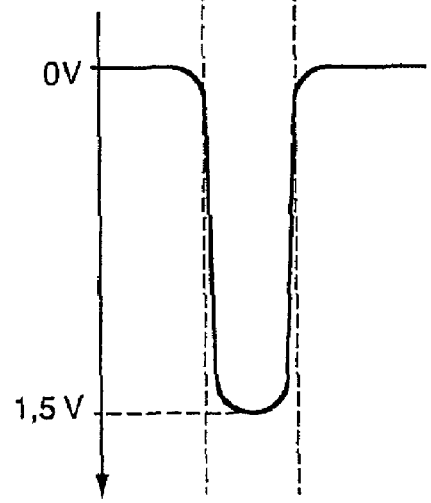
FIG. 3b illustrates schematically an example of self-biasing of a fully depleted photodiode according to the invention.

With such doping of the intermediate layer 2, the photodiode is then of the fully depleted type, that is to say it self-biases at a defined voltage when the concentration of the electrons in the layer 2 is zero at the end of transfer. In the example described, the photodiode self-biases at 1.5 volts (FIG. 3b).

Figure 4:
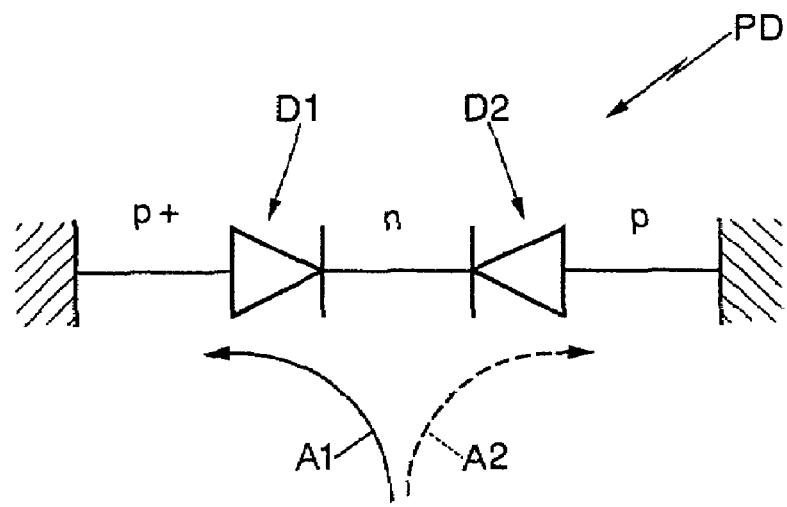
FIG. 4 is another schematic representation of a photodiode according to the invention, illustrating one way of implementing the method according to the invention.
Figure 5:
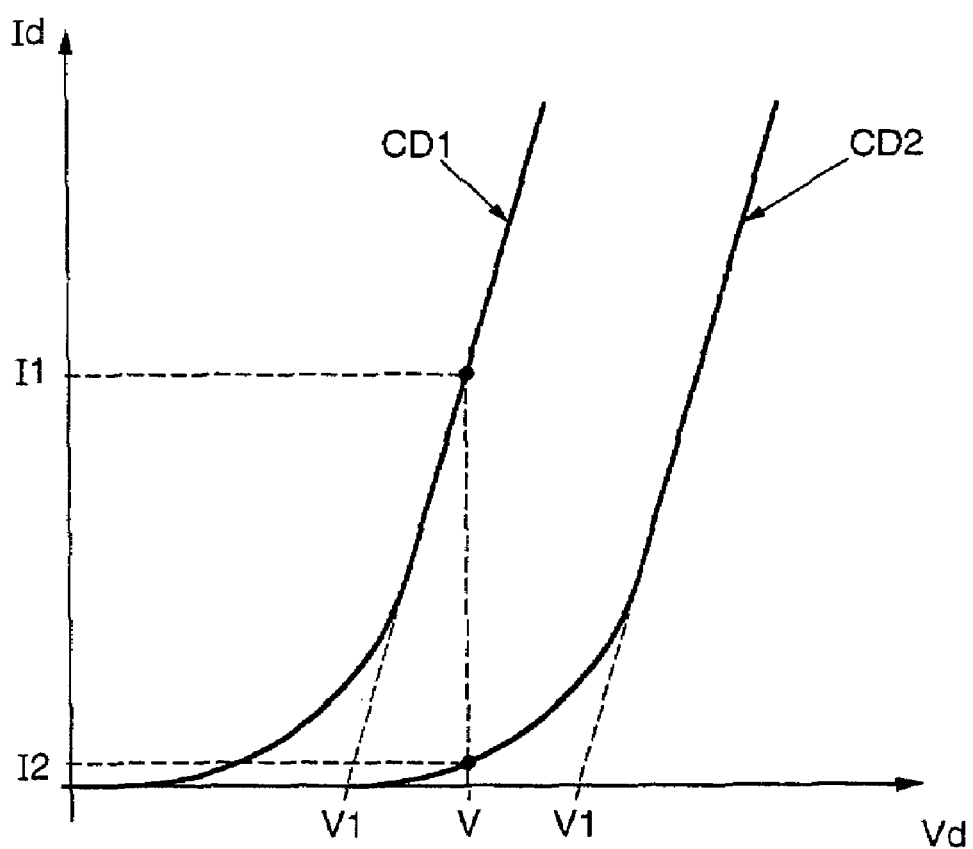
FIG. 5 shows two current-voltage curves relating to the two junctions of a photodiode according to the invention.

As illustrated in FIG. 4, and as indicated above, the photodiode PD is composed of two junctions (diodes) D1 and D2. These two diodes (D1 and D2 are chosen so that the forward bias voltage V1 of the diode D1 (FIG. 5) is lower than the forward bias voltage V2 of the diode D2. Consequently, the photodiode PD will store charges during its illumination until the upper junction D1 is forward biased.

The electrons "not storable" in the n-doped intermediate layer 2 will then be preferably transferred (arrow A1, FIG. 4) into the upper layer 3 to be recombined with the holes of this upper layer 3, and they will not diffuse into the substrate and disturb the neighbouring photodiodes.

Thus, depending on the characteristics CD1, CD2 (FIG. 5) of the junctions, there may also exist, simultaneously with the forward bias current I1 of the junction D1, a small forward bias current I2 of the junction D2.

However, in the example described here, a ratio of the current I1 to the current I2 of ten (10) generally allows good recombination of the electrons with the holes of the upper layer without the electrons that diffuse into the substrate (arrow A2, FIG. 4) being detrimental to the neighboring photodiodes.

As an indication, if a forward bias voltage V2 for the diode D2 is taken as 0.6 volts, a forward bias voltage V1 of 0.4 volts may for example be chosen for the junction D1.

Physically, to obtain this difference in forward bias voltage, it may be possible to choose a $p^+$implantation obtained with indium, while the p-doping of the substrate portion will be obtained with boron. The region 2 may itself be n-doped with phosphorus.

What is claimed is:

1. An integrated circuit comprising at least one cell that includes a photodiode able to control blooming effects,
wherein the photodiode comprises an upper layer, p_doped, over an intermediate layer, n_doped, over a portion of a semiconductor substrate, p_doped,
wherein the upper layer is more highly doped than the intermediate layer, wherein the maximum storage of charges in the intermediate layer is determined by a forward bias voltage between the upper layer and the intermediate layer, enabling the photodiode to control blooming effects by itself, wherein the at least one cell includes control means for controlling transfer of charges from the photodiode to an output of the at least one cell, the control means including a transfer transistor, the transfer transistor being a MOS transistor having a source that is also the intermediate layer of the photodiode, and wherein the photodiode is a fully depleted photodiode that self-biases at a defined voltage when a concentration of electrons in the intermediate layer becomes nearly zero after the transfer of charges from the photodiode to the output of the at least one cell.

2. The integrated circuit according to claim 1, wherein the forward bias voltage of a pn junction formed between the upper layer over the intermediate layer and a forward bias voltage of a pn junction formed between the intermediate layer over the portion of the semiconductor substrate are chosen to obtain a forward bias current of the upper junction at least ten times higher than the forward bias current of the lower junction.

3. The integrated circuit according to claim 1, wherein the doping of the upper layer is at least 5 times higher than the doping of the intermediate layer.

4. The integrated circuit according to claim 3, wherein the upper layer is formed from indium-doped silicon, wherein the intermediate layer is formed from phosphorus-doped silicon and wherein the substrate portion is formed from boron-doped silicon.

5. The integrated circuit according to claim 3, wherein the forward bias voltage of a pn junction formed between the upper layer over the intermediate layer and a forward bias voltage of a pn junction formed between the intermediate layer over the portion of the semiconductor substrate are chosen to obtain a forward bias current of the upper junction at least ten times higher than the forward bias current of the lower junction.

6. The integrated circuit according to claim 1, wherein the control means forms an integral part of the photodiode.

7. The integrated circuit according to claim 6, wherein the charges are stored in the photodiode when the transfer transistor is off and are transfeffed from the photodiode to its output when the transfer transistor is on.

8. The integrated circuit according to claim 7, wherein the unregulated, fixed supply voltage that is coupled to the gate of the transfer transistor remains at a same voltage both when the transfer transistor is on and when the transfer transistor is off.

9. The integrated circuit according to claim 7, wherein the transfer transistor turns on and off as a result of an amount of charge in the intermediate layer of the photodiode.

10. The integrated circuit according to claim 6, wherein transferring of charges from the photodiode to its output occurs as a result of an amount of charges stored in the intermediate layer of the photodiode.

11. The integrated circuit according to claim 1, wherein the MOS transistor has a drain coupled to an output of the photodiode and a gate coupled to an unregulated, fixed supply voltage.

12. An integrated circuit fabricated using complementary metal oxide semiconductor (CMOS) technology, the integrated circuit comprising:
   a plurality of cells, each cell including
      a photodiode, the photodiode including an upper layer, p_doped, over an intermediate layer, n_doped, over a portion of a semiconductor substrate, p_doped,
      wherein the upper layer is more highly doped than the intermediate layer, and wherein the maximum storage of charges in the intermediate layer is determined by a forward bias voltage between the upper layer and the intermediate layer, enabling the photodiode to control blooming effects by itself; and
   a transfer transistor for controlling transfer of charges from the photodiode to an output of the photodiode,
      wherein the source of the transfer transistor is also the intermediate layer of the photodiode,
      wherein the drain of the transfer transistor is coupled to an output of the cell, and
      wherein the gate of the transfer transistor is coupled to an unregulated, fixed supply voltage.

13. The integrated circuit according to claim 12, wherein the photodiode is a fully depleted photodiode.

14. The integrated circuit according to claim 12, wherein the doping of the upper layer is at least 5 times higher than the doping of the intermediate layer.

15. The integrated circuit according to claim 12, wherein the forward bias voltage of a pn junction formed between the upper layer over the intermediate layer and a forward bias voltage of a pn junction formed between the intermediate layer over the portion of the semiconductor substrate voltages of the two junctions are chosen to obtain a forward bias current of the upper junction at least ten times higher than the forward bias current of the lower junction.

16. The integrated circuit according to claim 12, wherein the upper layer is formed from indium-doped silicon, wherein the intermediate layer is formed from phosphorus-doped silicon and wherein the substrate portion is formed from boron-doped silicon.

17. The integrated circuit according to claim 12, wherein transfer of charges from the photodiode to its output occurs when a pn junction formed between the upper layer over the intermediate layer becomes forward biased.

18. The integrated circuit according to claim 12, wherein the electrons that are not storable in the intermediate layer are transfeffed into the upper layer for recombination with holes of the upper layer.

19. An integrated circuit comprising a plurality of cells, each cell further comprising:
   a photodiode, the photodiode including an upper layer over an intermediate layer over a subjacent portion of a semiconductor substrate,
      wherein the upper layer is formed from silicon p-doped with at least $10^{18}$ indium atoms per cubic centimeter,
      wherein the intermediate layer is formed from silicon n-doped with $10^{17}$ to $10^{18}$ phosphorus atoms per cubic centimeter,
      wherein the semiconductor substrate is formed from silicon p-doped with less than $10^{16}$ boron atoms per cubic centimeter, and
      wherein the maximum storage of charges in the intermediate layer is determined by a forward bias voltage between the upper layer and the intermediate layer, enabling the photodiode to control blooming effects by itself; and
   a MOS transistor for controlling transfer of charges from the photodiode to an output of the cell, wherein the MOS transistor has a source that is also the intermediate layer of the photodiode.

20. The integrated circuit according to claim 19, wherein the MOS transistor has a drain coupled to the output of the photodiode and a gate coupled to an unregulated, fixed supply voltage.

* * * * *